United States Patent
Okonogi et al.

(10) Patent No.: US 7,338,876 B2
(45) Date of Patent: Mar. 4, 2008

(54) METHOD FOR MANUFACTURING A SEMICONDUCTOR DEVICE

(75) Inventors: Kensuke Okonogi, Tokyo (JP); Kiyonori Oyu, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 40 days.

(21) Appl. No.: 11/039,857

(22) Filed: Jan. 24, 2005

(65) Prior Publication Data
US 2005/0164448 A1 Jul. 28, 2005

(30) Foreign Application Priority Data
Jan. 23, 2004 (JP) ............................. 2004-015022

(51) Int. Cl.
*H01L 21/331* (2006.01)
(52) U.S. Cl. ............... 438/369; 438/519; 438/542; 438/548
(58) Field of Classification Search ............... 438/499, 438/495, 501–502, 505–506, 508–509, 529–530, 438/528, 682, 775, 253, 301, 306, 585, 542, 438/519, 521–522, 369, 514, 527, 540, 546, 438/548, 550, 560, FOR. 298, FOR. 242; 257/191, 290, 296, 412, 616
See application file for complete search history.

(56) References Cited

U.S. PATENT DOCUMENTS

| | | | | |
|---|---|---|---|---|
| 3,808,060 A | * | 4/1974 | Hays et al. ............... | 438/376 |
| 4,697,332 A | * | 10/1987 | Joy et al. ............... | 438/420 |
| 4,927,777 A | * | 5/1990 | Hsu et al. ............... | 438/305 |
| 5,362,670 A | * | 11/1994 | Iguchi et al. ............... | 438/228 |
| 6,372,590 B1 | * | 4/2002 | Nayak et al. ............... | 438/305 |
| 6,475,887 B1 | * | 11/2002 | Kawasaki et al. ............... | 438/528 |
| 6,559,018 B1 | * | 5/2003 | Liu et al. ............... | 438/303 |
| 6,890,854 B2 | * | 5/2005 | Lee et al. ............... | 438/682 |
| 6,900,521 B2 | * | 5/2005 | Forbes et al. ............... | 257/616 |
| 7,071,067 B1 | * | 7/2006 | Ahmad ............... | 438/302 |
| 7,109,536 B2 | * | 9/2006 | Nakabayashi ............... | 257/290 |
| 2001/0019871 A1 | * | 9/2001 | Yamaguchi et al. ............... | 438/301 |

FOREIGN PATENT DOCUMENTS

| | | |
|---|---|---|
| JP | 661486 | 3/1994 |
| JP | 2003017586 | 1/2003 |

* cited by examiner

*Primary Examiner*—Scott B. Geyer
*Assistant Examiner*—Thanh Y. Tran
(74) *Attorney, Agent, or Firm*—Young & Thompson

(57) ABSTRACT

A method for forming a semiconductor memory device includes the steps of: implanting a dopant in a semiconductor substrate; heat treating the semiconductor substrate in an oxidizing ambient to diffuse the dopant for forming diffused regions in the semiconductor substrate; and forming memory cells each including a MOS transistor having the diffused regions as source/drain regions.

9 Claims, 7 Drawing Sheets

METHOD FOR MANUFACTURING A SEMICONDUCTOR DEVICE

BACKGROUND OF THE INVENTION

1. Field of the Invention

The present invention relates to a method for manufacturing a semiconductor device, and more specifically, to a method for manufacturing a semiconductor device, which is suited to manufacture of memory cells in DRAM devices, SRAM devices, and the like for use in mobile information terminals such as cellular phones.

2. Description of Related Art

Memory cells in DRAMs or SRAMs used in mobile information terminals especially require MOS transistors that cause a small junction leakage current. FIG. 9 shows a structure of a semiconductor device described in Patent Publication JP-A-2003-17586, as an example of a conventional semiconductor device.

In the semiconductor device 51, a plurality of MOS transistors arranged in the form of pairs of transistors which share a bit line 11 are formed on a semiconductor substrate 31, as shown in the figure. The semiconductor substrate 31 has shallow-trench isolation regions-where an insulating film 12 is filled, and active regions isolated from one another by the element isolation regions. The pair of transistors are formed in a single active region. Each active region is formed in a common p-type well layer 13 to which a substrate potential is applied, and has a p-type channel layer 14 which determines the threshold voltage of the transistors. An n-type buried well layer not shown is formed below the p-type well layer 13.

On both sides of the plug 15 connected to the bit line 11, two gate electrodes 16 each having side spacers 18 are disposed. Each gate electrode 16 is formed on the p-type channel layer 14, with a gate insulating film 17 interposed therebetween. An n-type lightly-doped diffused region 19 which configures a source/drain diffused region is connected to the plug 15 coupled to the bit line 11 or to another plug 15 coupled to a capacitor 20 through a plug 21. The plugs 15 are configured from a polysilicon film doped with phosphorous and fill the contact holes penetrating to the top surface of the p-type channel layer 14 from the top surface of an interlayer dielectric film 22.

In the semiconductor device 51 shown in FIG. 9, phosphorus is implanted to form an electric-field-alleviation layer 91 for the purpose of alleviating the electric fields, after forming the contact holes, in the process of forming the plugs 15. Implantation of phosphorus to alleviate electric fields is generally effected at a depthwise position deeper than the n-type lightly-doped diffused regions 19 as shown in the figure. This technique is described in Patent Publication JP-B-3212150, for example. Interlayer dielectric films 23 and 24, in which the bit line 11 and the plugs 21 are formed, are interposed between the plugs 15 along with the interlayer dielectric film 22 and the capacitors 20.

With respect to the method for manufacturing a semiconductor device, as shown in FIG. 9, a description will now be made particularly of a process of the step of forming the n-type lightly-doped diffused regions 19. After the side surfaces of the gate electrode 16 and the main surface of the semiconductor substrate 31 are thermally oxidized, phosphorus implantation is carried out onto the surface of the semiconductor substrate 31 at a dosage of $2\times10^{13}/cm^2$ and an acceleration energy of 10 KeV, while using this gate electrode structure as a mask. Next, a heat treatment for diffusing implanted phosphorus is carried out to form the n-type lightly-doped diffused regions 19 forming a source/drain diffused region. This heat treatment subsequent to the phosphorus implantation is carried out to serve also to diffusing the dopant, which is implanted to form a lightly-doped diffused regions for transistors in the peripheral circuits, or else the heat treatment is carried out immediately after the phosphorus implantation. In any case, the heat treatment is effected in a nitrogen ambient at a substrate temperature of 900 to 1000° C. for several tens of seconds.

In recent years, miniaturization of memory cells has been progressing more and more because of demands for higher integration of DRAMs. To achieve this miniaturization, the gate length has to be shortened while maintaining the threshold voltage of transistors. The doping density of the channel layer is raised in consistence therewith. Consequently, the junction electric field between the channel layer and the source/drain diffused region becomes large, causing an increase in the junction leakage current, which lowers the data retention capability of memory cells. To reduce the junction leakage current, there are a method of alleviating the electric field strength at the junctions, and another method of reducing vacancy type defects which are the origins of the junction leakage current.

In order to prevent deterioration of the data retention capability, discussions have been made as to various kinds of methods which would reduce the junction leakage current by means of alleviation of electric field strength at the junctions in a source/drain diffused region. For example, Patent Publication JP-B-3212150 proposes that doping density (carrier density) distributions of p-type and n-type layers are set so that the electric field at the junctions might not exceed 1 MV/cm, at which the local Zener effect becomes dominant. However, as further miniaturization of semiconductor devices has been proceeding, the method of reducing the junction leakage current by alleviating electric field strength has come close to the upper limit of itself. This is on the ground that the impurity density has to be higher in the channel layer in order to reduce the gate length while maintaining the threshold voltage of the cell transistors in a semiconductor memory device. However, as the channel-doping density becomes higher, the junction electric field becomes larger accordingly. Hence, much attention is paid to the method of reducing the vacancy type defects in the crystal structure, which remain in the source/drain diffused regions of the silicon substrate.

According to the literature "Defects related to DRAM leakage current studied by electrically detected magnetic resonance", Physica B, vol. 308-310, pp. 1169-1172, 2001, written by T. Umeda, Y. Mochizuki, K. Okonogi, and K. Hamada, as shown in FIG. 10, it is known that the vacancy type defect includes divacancy plus one or two oxygen atoms within the lattice structure of the silicon substrate, as shown in FIG. 10. The vacancy type defect is also associated with neighboring dangling bonds 52, which are uncoupled bonds of silicon atoms. The vacancy type defects are raised to an energy level within the energy bandgap by the presence of the dangling bonds 52, thereby generating junction leakage-current due to this energy level. The junction leakage current reduces the data retention time of the memory cell, as described before.

SUMMARY OF THE INVENTION

In view of the above, it is an object of the present invention to provide a method for manufacturing a semiconductor device, such as DRAM and SRAM devices, by performing a treatment on the vacancy type defects remaining in a source/drain diffused region to reduce the junction leakage current caused by the vacancy type defects and improve the data retention capability of the memory cells in the semiconductor memory device.

The present invention provides, in a first aspect thereof, a method for manufacturing a semiconductor device including the steps of: implanting a dopant in a semiconductor substrate; heat treating the semiconductor substrate in an oxidizing ambient to diffuse the dopant thereby forming diffused regions in the semiconductor substrate; and forming a MOS transistor including the diffused regions.

According to the first aspect of the present invention, since the heat treatment subsequent to implantation of the dopant for forming the source/drain diffused region is carried out in an oxidizing gas ambient, an oxide film will grow on the semiconductor substrate or an oxide film previously formed on the silicon substrate will grow to increase the thickness thereof. Interstitial silicon atoms generated at the interface between the oxide film and the semiconductor substrate are supplied to the source/drain diffused regions. As a result, the number of vacancies in the source/drain diffused regions is reduced, and thereby the vacancy type defects concentrated on and remaining in the stress risers of the source/drain diffused regions are reduced. Accordingly, the junction leakage current of the MOS transistor caused by those defects can be reduced.

The present invention provides, in a second aspect thereof, a method for manufacturing a semiconductor device including the consecutive steps of: implanting a dopant in a semiconductor substrate; heat treating the semiconductor substrate to diffuse the dopant for forming source/drain diffused regions in the semiconductor substrate; implanting silicon or nitrogen in top portions of the source/drain diffused regions; heat treating the semiconductor substrate to diffuse the silicon or nitrogen in the source/drain diffused regions; and forming a MOS transistor including the source/drain diffused regions.

According to the second aspect of the present invention, implantation of silicon or nitrogen and a heat treatment for diffusing the implanted silicon or nitrogen are performed after the heat treatment for diffusing the dopant to form the source/drain diffused regions. As a result, vacancies remaining at the stress risers of the source/drain diffused regions are substituted for by the implanted silicon or nitrogen, thereby reducing the dangling bonds in the vicinity of the junctions of the source/drain regions. Accordingly, the junction leakage current of the MOS transistor caused by the vacancy type defects can be reduced.

The above and other objects, features and advantages of the present invention will be more apparent from the following description, referring to the accompanying drawings.

DETAILED DESCRIPTION OF THE PREFERRED EMBODIMENTS

Figure 1A:
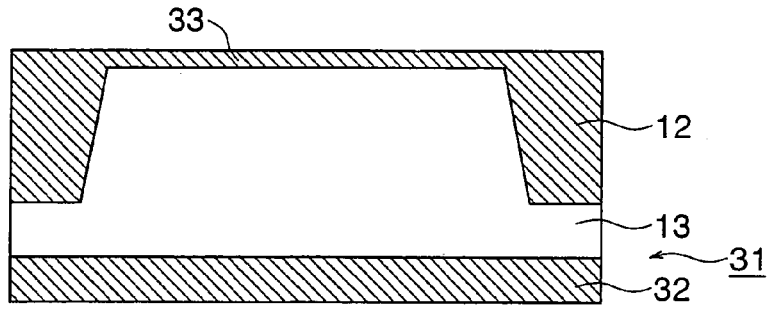
FIGS. 1A to 1H are sectional views showing process steps in a method for manufacturing a semiconductor device, according to a first embodiment of the present invention.

The present inventors have had the following discussions prior to the present invention. In general cases, vacancies and interstitial silicon are formed in a silicon substrate by dopant implantation for forming source/drain diffused regions. However, the interstitial silicon is diffused quickly by a heat treatment performed after the dopant implantation. Therefore, vacancies become excessive in the source/drain diffused regions. These vacancies are concentrated on the end portion of a gate electrode within the source/drain diffused regions and stay therein because this part is a stress riser where the stress is concentrated. The present inventors hence reached an assumption that, if the heat treatment is carried out in an oxidizing ambient, the interstitial silicon atoms are generated at the interface between a growing oxide film and the silicon substrate on the substrate surface. The interstitial silicon atoms can alleviate the situation of the excessive existence of vacancies, so that vacancy type defects concentrated on the stress riser are reduced and the junction leakage current caused by the vacancy type defects is reduced.

Experiments were carried out based on the assumption described above. As a result, an excellently effective reduction in the junction leakage current was achieved where a heat treatment in an oxidizing ambient after the implantation was executed for 1 to 60 seconds at a substrate temperature within a range of 900 to 1100° C., particularly when phosphorus was used as a dopant and the dosage of phosphorus implantation was within a range of $1 \times 10^{13}/cm^2$ to $1 \times 10^{14}/cm^2$.

The range of dosage as described above is preferable on the following grounds. That is, if the dosage of phosphorus implantation is $1 \times 10^{13}/cm^2$ or less, the amount of vacancies generated by the implantation can be substantially negligible. If the dosage of the phosphorus implantation is $1 \times 10^{13}/cm^2$ or more, the amount of generated vacancies is not negligible in view of the amount of vacancy type defects remaining after the heat treatment, i.e., increase in the junction leakage current. If the dosage of the phosphorus implantation exceeds $1 \times 10^{14}/cm^2$, stacking fault defects grow disadvantageously when the heat treatment is performed in an oxidizing ambient.

The substrate temperature to perform the heat treatment does not cause problems so long as the substrate temperature is within a range in which implantation damages are sufficiently recovered and redistribution of phosphorus is effected. It is to be noted that the above-described range of the substrate temperature to perform the heat treatment is set while assuming a single wafer processing. If the substrate temperature is lower than 900° C., recovery of implantation damages are insufficient. On the other hand, if the temperature exceeds 1100° C., the influence on redistribution of phosphorus is not negligible.

Meanwhile, consideration is taken into another case in which silicon or nitrogen is implanted and a further heat treatment is carried out, after the vacancy type defects are formed at the stress riser in the source/drain diffused regions by the dopant implantation to form the source/drain diffused regions and a subsequent heat treatment to diffuse the implanted dopant. In this case, the implanted silicon or nitrogen is diffused in the stress riser and is substituted for the vacancies remaining in the stress riser. The residual vacancy type defects then decrease. If the silicon atoms are substituted for vacancies, dangling bonds disappear because the silicon atom has four hands to be coupled. Alternatively, if nitrogen atoms are substituted for vacancies, the total amount of dangling bonds greatly decreases because the nitrogen atom has three hands to be coupled although few dangling bonds still remain. In any cases, the junction leakage current caused by the vacancy type defects can be reduced.

As another result of experiments, an excellently effective reduction in the junction leakage current was achieved by setting the acceleration energy such that the implanted range of the accelerated silicon or nitrogen is equal to or less than half the thickness of the source/drain diffused regions, particularly under the following conditions. For the case where phosphorus was a dopant, the dosage of phosphorus implantation was within a range of $1\times10^{13}/cm^2$ to $1\times10^{14}/cm^2$, and the thickness of the source/drain diffused regions after the heat treatment was about 200 nm or less.

Of the above-described range of the dosage of the phosphorus implantation, the lower limit is set on the same ground as described previously. The upper limit thereof is set as a limit at which an excellent reduction in the junction leakage current could be achieved. The acceleration energy of silicon or nitrogen is set to prevent damages caused by silicon or nitrogen implantation from spreading beyond the source/drain diffused regions. That is, if those implantation damages spread beyond the source/drain diffused regions, the junction leakage current increases adversely.

As a further result of experiments, an excellently effective reduction in the junction leakage current was achieved by setting the dosage of silicon or nitrogen implantation within a range of $1\times10^{13}/cm^2$ to $1\times10^{14}/cm^2$. The lower-lit of this dosage is set to provide an excellent effect of reduction in the junction leakage current. The upper limit thereof is set not to involve an increase in the junction leakage current due to damages caused by implantation of silicon or nitrogen.

When silicon or nitrogen was implanted and a heat treatment was then carried out subsequent to the dopant implantation to form the source/drain diffused region, the same state was obtained as obtained when implantation damages were increased simply by a dopant. The junction leakage current increased adversely. Therefore, implantation of silicon or nitrogen should be performed after the heat treatment to diffuse the dopant.

Hereinafter, with reference to the drawings, the present invention will be described in more details on the basis of embodiments according to the present invention. FIGS. 1A to 1H are sectional views respectively showing process steps of manufacturing a semiconductor device according to the first embodiment of the present invention.

As shown in FIG. 1A, shallow trenches are first formed in the main surface of a silicon substrate 31. Thereafter, an insulating film 12 is filled in the shallow trenches to form shallow-trench isolation regions. Subsequently, a silicon oxide film 33 having a thickness of 10 nm is formed on the substrate surface. Through the silicon oxide film 33, phosphorus implantation is carried out at an acceleration energy of 1000 keV and a dosage of $1\times10^{13}/cm^2$, to form an n-type buried well layer 32. Through the silicon oxide film 33, boron implantation is carried out four times at an acceleration energy of 300 keV and a dosage of $1\times10^{13}/cm^2$, at acceleration energy of 150 keV and a dosage of $5\times10^{12}/cm^2$, at an acceleration energy of 50 keV and a dosage of $1\times10^{12}/cm^2$, and at an acceleration energy of 10 keV and a dosage of $2\times10^{12}/cm^2$, respectively. Thereafter, a heat treatment is carried out at a substrate temperature of 1000° C. for 30 minutes, to form a p-type well layer 13.

Figure 1B:
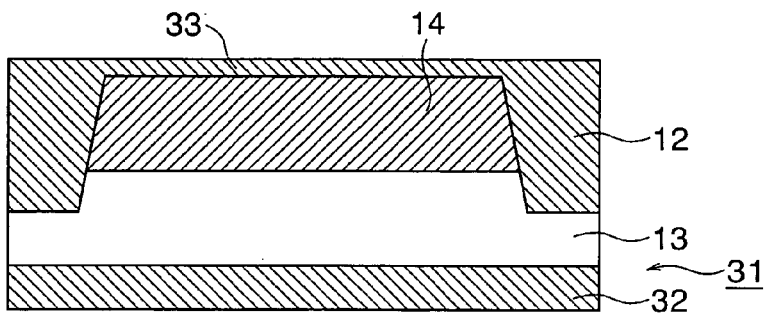

Next, as shown in FIG. 1B, boron is implanted at an acceleration energy of 10 keV and a dosage of $1\times10^{13}/cm^2$. Thereafter, a heat treatment is carried out at a substrate temperature of 1000° C. for 10 seconds in a nitrogen ambient, to form a p-type channel layer 14.

Figure 1C:
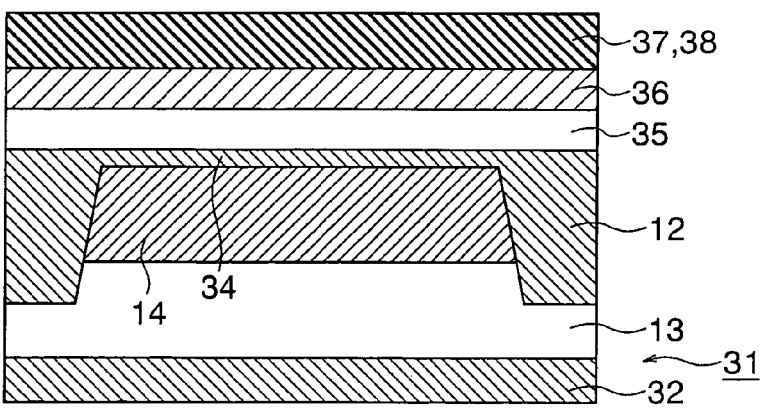

Subsequently, as shown in FIG. 1C, the silicon oxide film 33 is removed, and the gate oxide film 34 having a thickness of 7 nm is formed by a thermal oxidation technique. Subsequently, a polysilicon film 35 having a thickness of 70 nm and doped with phosphorus at a high density, a tungsten silicide film 36 having a thickness of 100 nm, a silicon oxide film 37 having a thickness of 30 nm, and a silicon nitride film 38 having a thickness of 150 nm are formed sequentially on the gate oxide film 34.

Figure 1D:
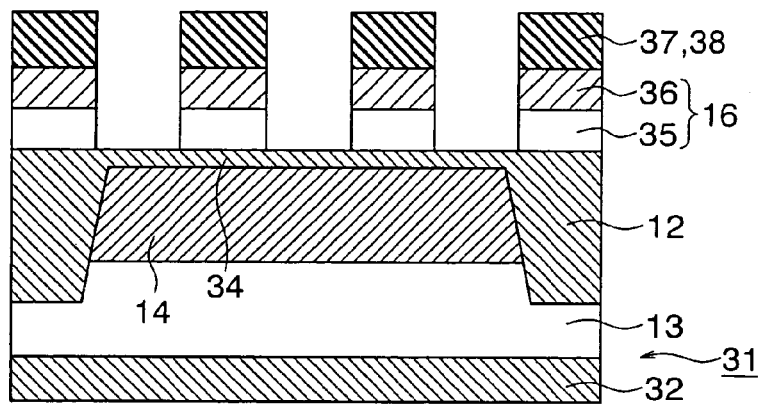

Next, as shown in FIG. 1D, patterning is performed on the silicon nitride film 38, silicon oxide film 37, tungsten silicide film 36, and polysilicon film 35, to obtain a gate electrode structure.

Figure 1E:
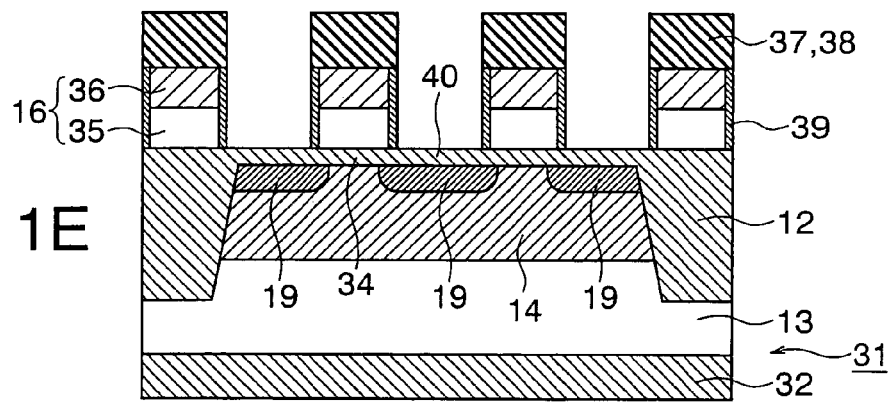

Thereafter, as shown in FIG. 1E, a silicon oxide film 39 having a thickness of 10 nm is formed on side surfaces of the polysilicon film 35 and tungsten silicide film 36 which configure gate electrodes 16, by a thermal oxidation technique. During this thermal oxidation process, oxidation is also effected on the residues of the gate oxide film 34 formed on the substrate surface after the patterning to form the gate electrode structure, and accordingly a silicon oxide film 40 having a thickness of 8 nm is formed.

Next, using the gate electrode structure as a mask, phosphorus implantation is carried out through the silicon oxide film 40, at an acceleration energy of 15 KeV and a dosage of $9\times10^{12}/cm^2$, and at an acceleration energy of 10 KeV and a dosage of $9\times10^{12}/cm^2$. Subsequently, a heat treatment is carried out at a substrate temperature of 1000° C. for 10 seconds in a dry oxygen ambient, to form n-type lightly-doped diffused regions 19 which configure source/drain diffused regions. In a conventional method for manufacturing a semiconductor device, a heat treatment is carried out in a nitrogen ambient. However, it has been confirmed by a SIMS (Secondary Ion-microscope Mass Spectrometry) analysis technique that the result of redistribution of phosphorus does not substantially differ even if the heat treatment is carried out in an oxidizing ambient like in the present embodiment. Also, under the heat treatment conditions as described above, the film thickness of the silicon oxide film 40 after the heat treatment falls within a range not greater than 1.1 times the film thickness of the silicon oxide film 40 before the heat treatment. As a result, excessive oxidation of the side walls of the gate electrodes 16 is restrained, preventing an offset structure formed between the gate electrodes 16 and the n-type lightly-doped diffused regions 19.

Next, diffused regions for MOS transistors in the peripheral circuits not shown are formed in a known method. Then, a silicon nitride film 41 having a thickness of 50 nm and a silicon oxide film 42 having a thickness of 300 nm are deposited. Subsequently, the silicon oxide film 42 is planarized by use of a commonly-used planarizing technique, and thereafter, the silicon oxide film 42 and silicon nitride film 41 are etched sequentially to form through-holes 44a.

Figure 1F:
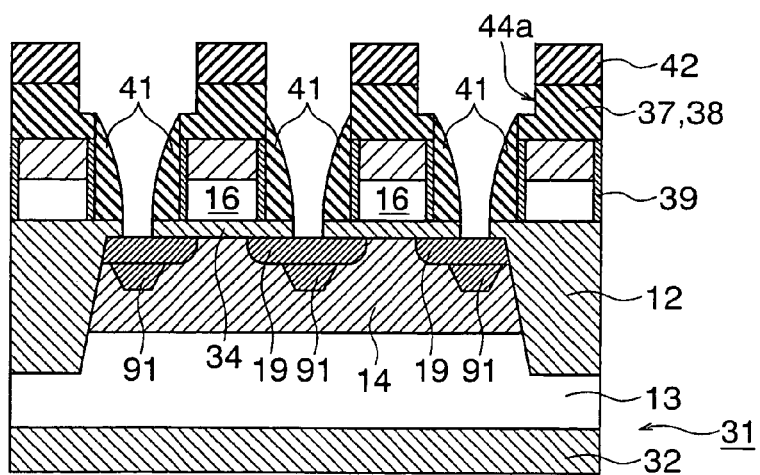

Thereafter, phosphorus implantation is carried out at an acceleration energy of 30 KeV and a dosage of $1 \times 10^{13}/cm^2$, and thereafter, a heat treatment is carried out at a substrate temperature of 950° C. for 10 seconds in a nitrogen ambient, to form electric field alleviation layers 91 as shown in FIG. 1F to alleviate electric fields. Subsequently, arsenic implantation is carried out at an acceleration energy of 20 KeV and a dosage of $2 \times 10^{13}/cm^2$, to reduce the resistance of the n-type lightly-doped diffused regions 19.

Figure 1G:
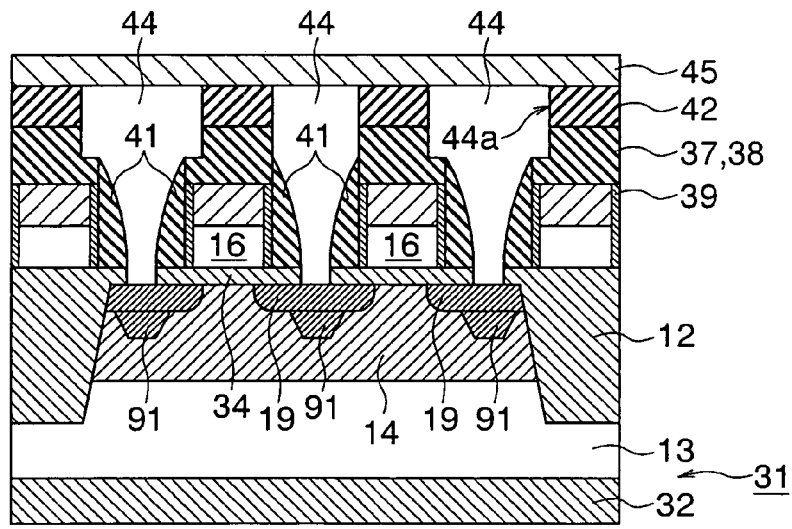

Next, as shown in FIG. 1G, polysilicon doped with phosphorus at a high density is deposited inside the through holes 44a and on the silicon oxide film 42. Then, the polysilicon is etched back by use of a commonly-used method, to form plugs 44 buried in the through holes 44a. Subsequently, a silicon oxide film 45 having a thickness of 100 nm is deposited, and thereafter, a heat treatment is carried out at a substrate temperature of 950° C. for 10 seconds.

Figure 1H:
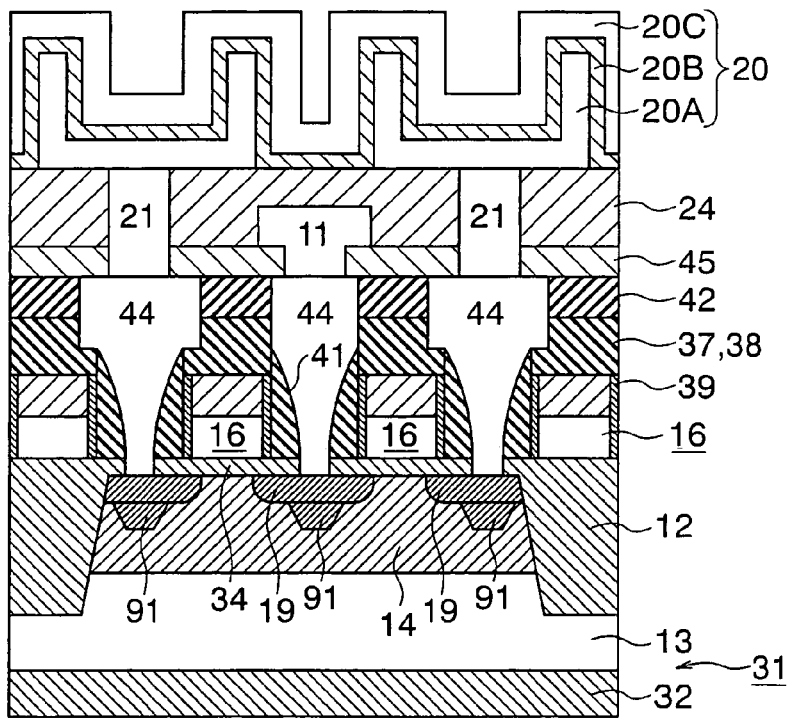

Thereafter, by use of a commonly-used method, an interlayer dielectric film 24 is deposited on the silicon oxide film 45, a bit line 11 connected to the center plug 44 is formed in the silicon oxide film 45 and the interlayer dielectric film 24, and plugs 21 connected to the other plugs 44 on both sides of the center plug 44 are formed. Subsequently, by use of a commonly-used manufacturing method, capacitors 20 constituted by lower electrodes 20A connected to the plugs 21, a capacity film 20B, and upper electrodes 20C are formed. Thus, the semiconductor device shown in FIG. 1H is completed.

According to the present embodiment, since the heat treatment for diffusing phosphorus in the n-type lightly-doped diffused regions 19, which is performed subsequent to the phosphorus implantation for forming the n-type lightly-doped diffused regions 19, is carried out in an oxygen ambient, an excessively large number of vacancies do not remain in the n-type lightly-doped diffused regions 19, thereby reducing the number of vacancy type defects concentrated on and remaining in the stress risers. Thus, the junction leakage current caused by those defects can be reduced.

Figure 2:
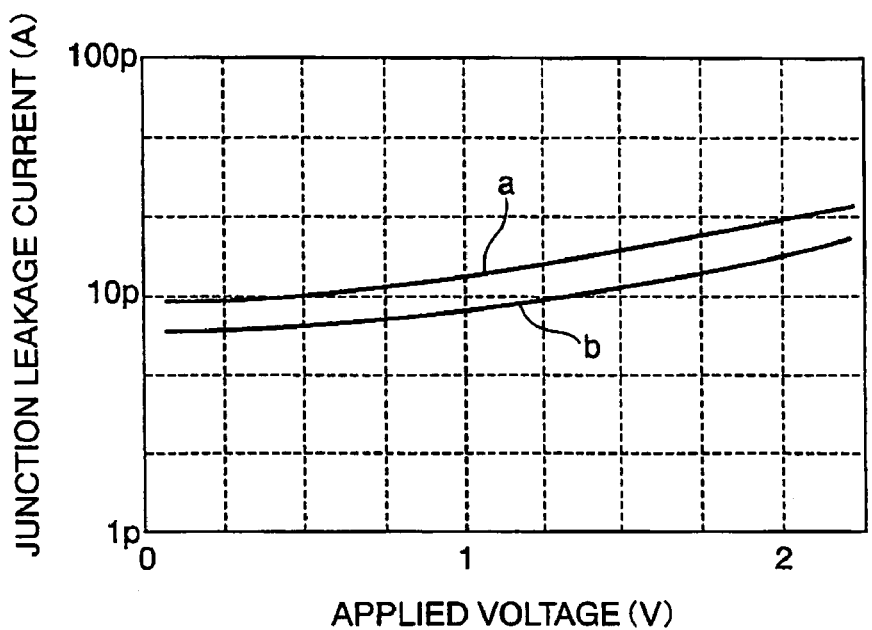
FIG. 2 is a graph showing the relationship between the junction leakage current of 10-kilobit memory cells and an applied voltage.
Figure 3:
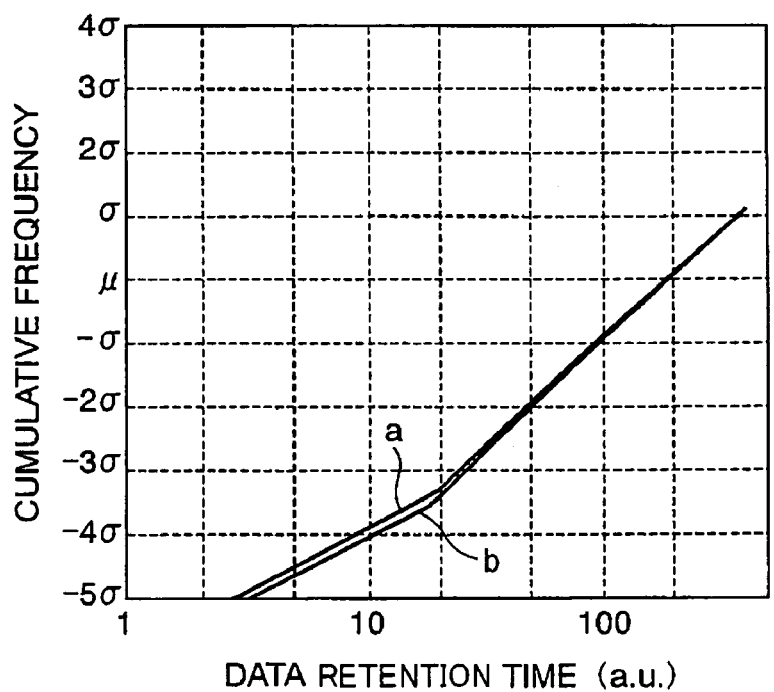
FIG. 3 is a graph showing the relationship between the cumulative frequency and the data retention time in a DRAM device.

Semiconductor devices were manufactured according to the present embodiment and a conventional method for manufacturing a semiconductor device. The thus manufactured devices are referred to as Example 1 and a comparative example, respectively. The semiconductor devices of the Example 1 and comparative example were investigated as to the relationship between the junction leakage current of 10-kilobit memory cells and an applied voltage, thereby providing the graphs as shown in FIG. 2. The "applied voltage" was applied through the bit line 11 under the conditions that the substrate voltage which was applied to the p-type well layer 13 including the p-type channel layer 14 was −1 V and that the substrate temperature was 85° C. In these conditions, the data retention time of the memory cells was also measured, and cumulative frequency was counted therefrom. The results thus obtained are shown in FIG. 3. In these figures, the characteristic curves "a" indicate the characteristics of the semiconductor device according to the comparative example, and the characteristic curves "b" indicate the characteristics of the semiconductor device according to the Example 1.

It can be understood from FIG. 2 that the junction leakage current in the semiconductor device of the Example 1 was reduced by about 20% from the semiconductor device of the comparative example. From FIG. 3, it can be understood that the data retention capability of the semiconductor device of the Example 1 was improved in comparison with the semiconductor device of the comparative example. These facts would prove that the data retention capability of the memory cells in a semiconductor device is ruled by the junction leakage current caused by vacancy type defects remaining in the n-type lightly-doped diffused regions 19.

A description will now be made of a method for manufacturing a semiconductor device according to the second embodiment of the present invention. The steps of the first embodiment up to the step of forming the gate electrode structure, as shown in FIGS. 1A to 1D, and the steps of the first embodiment after forming the n-type lightly-doped diffused regions 19, as shown in FIGS. 1F to 1H are common to the second embodiment. Subsequently to the formation of the gate electrode structure described with reference to FIG. 1D, a silicon oxide film 39 having a thickness of 10 nm is formed on the side surfaces of polysilicon film 35 and tungsten silicide film 36 which configure the gate electrodes 16, according to a thermal oxidation technique. During this thermal oxidation, residues of the gate oxide film 34 formed after patterning the gate electrode structure are subjected to the oxidation, to form a silicon oxide film 40 having a thickness of 8 nm, on the substrate surface.

Figure 4:
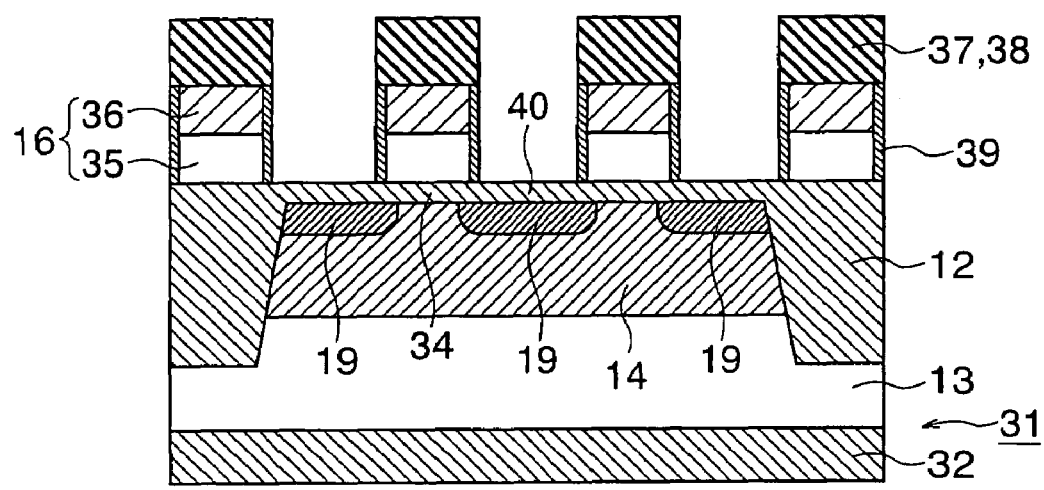
FIG. 4 is a sectional view showing a process step in a method for manufacturing a semiconductor device, according to a second embodiment of the present invention.

Next, with the gate electrode structure used as a mask, phosphorus implantation is carried out at an acceleration energy of 20 KeV and a dosage of $1.8 \times 10^{13}/cm^2$, through the silicon oxide film 40. Further, a heat treatment is carried out at a substrate temperature of 1000° C. for 10 seconds in a nitrogen ambient, to form the n-type lightly-doped diffused regions 19 which configures source/drain diffused regions, as shown in FIG. 4. Subsequently, silicon implantation is carried out at an acceleration energy of 7 KeV and a dosage of $2 \times 10^{13}/cm^2$, and a heat treatment is carried out at a substrate temperature of 950° C. for 10 seconds in a nitrogen ambient. By this heat treatment, implanted silicon can be diffused deeply toward the stress risers of the n-type lightly-doped diffused regions 19 where the vacancy type defects remain.

According to the present embodiment, the silicon implantation and the heat treatment for diffusing the implanted silicon are thus carried out after the heat treatment subsequent to the phosphorus implantation for forming the n-type lightly-doped diffused regions 19. Therefore, vacancies remaining at the stress risers of the n-type lightly-doped diffused regions 19 are substituted for by the implanted silicon, thereby reducing the number of dangling bonds. Accordingly, the junction leakage current caused by vacancy type defects can be reduced.

If the heat treatment for diffusing phosphorus, which is subsequent to the phosphorus implantation for forming the n-type lightly-doped diffused regions 19, is carried out in an oxidizing ambient like in the first embodiment, the effect of reducing the junction leakage current is attained more conspicuously in the present embodiment.

Also, in the present embodiment, nitrogen implantation and a heat treatment for diffusing the implanted nitrogen may be carried out in place of the silicon implantation and the heat treatment for diffusing the implanted silicon. In this case, a similar effect can be attained although the effect may be somewhat lower compared with the original effect of the present embodiment. Also, in the present embodiment, the silicon or nitride implantation and the heat treatment for diffusing the implanted silicon or nitrogen may be carried out after the phosphorus implantation for forming the electric field alleviation layer 91 as described with reference to FIG. 1F. In this case, a similar effect can be also attained, although the effect may be somewhat lower compared with the original effect of the present embodiment.

Figure 5:
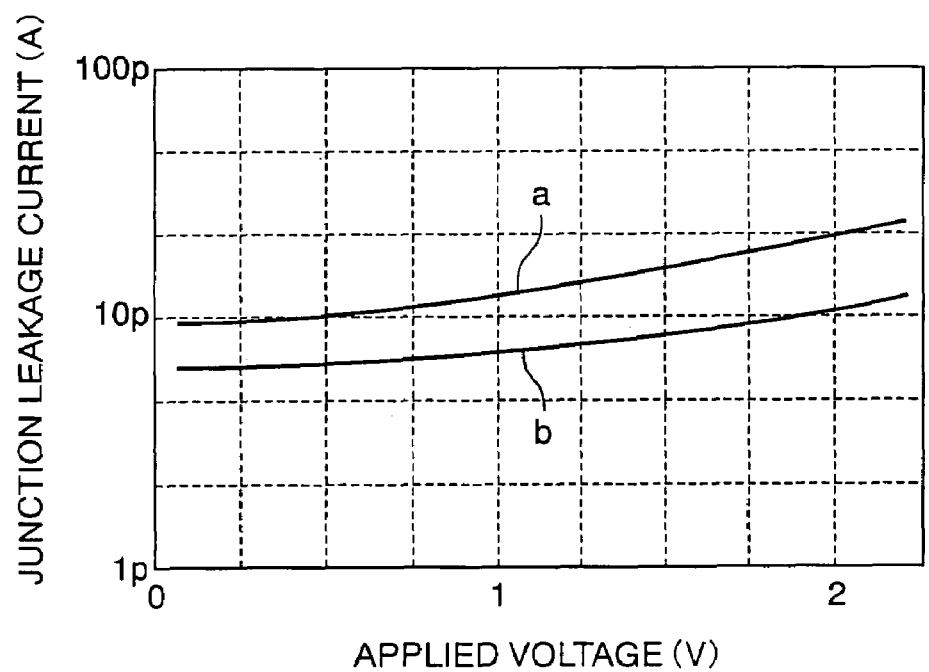
FIG. 5 is a graph showing the relationship between the junction leakage current of 10-kilobit memory cells and an applied voltage in a DRAM device.
Figure 6:
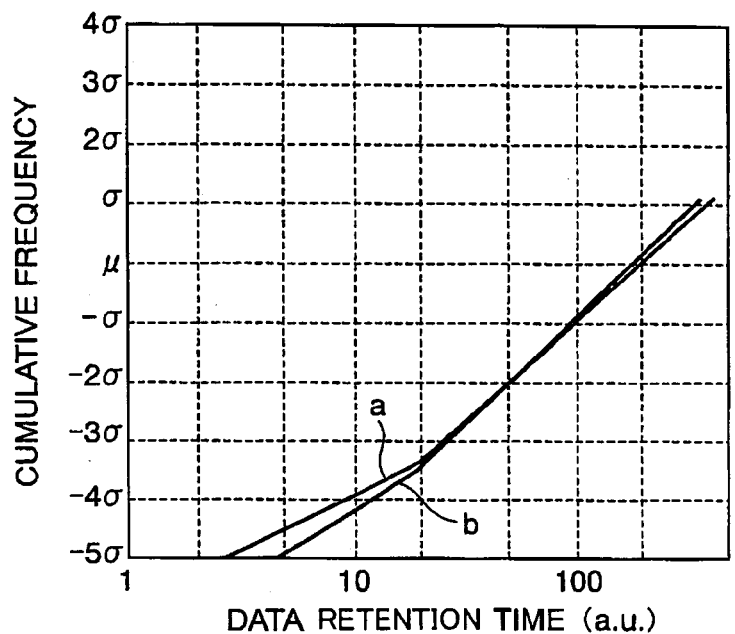
FIG. 6 is a graph showing the relationship between the cumulative frequency and the data retention time in the DRAM device.

A semiconductor device was manufactured according to the method for manufacturing a semiconductor device in the present embodiment and was referred to as Example 2 herein. The semiconductor device of the Example 2 was investigated as to the relationship between the junction leakage current of 10-kilobit memory cells and an applied voltage, thereby providing the graphs as shown in FIG. 5. Measurements were carried out under conditions similar to the conditions used for the measurements represented in FIG. 2. In addition, the data retention times of the memory cells were measured, and cumulative frequency was counted therefrom. The results thus obtained are shown in FIG. 6. In these figures, the characteristic curves "a" indicate the characteristics of the semiconductor device according to the comparative example as compared with the first embodiment, and the characteristic curves "b" indicate the characteristics of the semiconductor device according to the Example 2.

It can be understood from FIG. 5 that the junction leakage current in the semiconductor device of the Example 2 was reduced by half the leakage current in the semiconductor device of the comparative example. From FIG. 6, it can be understood that the data retention capability of the semiconductor device of the Example 2 was improved in comparison with the semiconductor devices of the comparative example and the Example 1.

Figure 7:
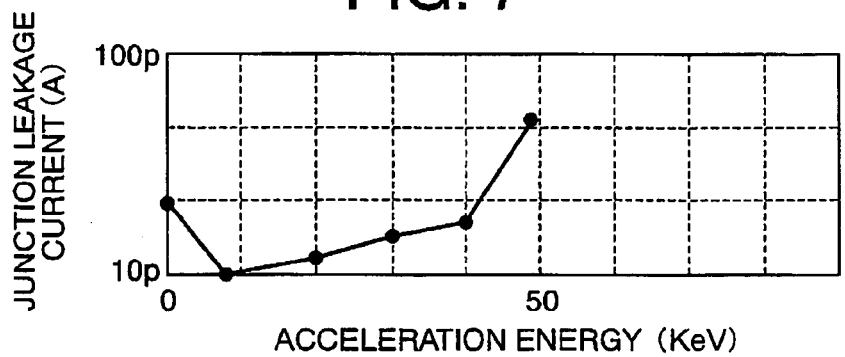
FIG. 7 is a graph showing the relationship between the junction leakage current of 10-kilobit memory cells and an acceleration energy.

FIG. 7 shows the relationship between the junction leakage current of 10-kilobit memory cells and the acceleration energy, which was obtained by changing the acceleration energy of silicon implantation, in the method for manufacturing the semiconductor device according to the present embodiment. Measurements were carried out under conditions that the voltage applied through the bit line 11 was 2 V, the substrate voltage applied to the p-type well layer 13 including the p-type channel layer 14 was −1 V, and the substrate temperature was 85° C. The point at which the acceleration energy is zero indicates the case where silicon implantation was not carried out.

The junction leakage current increases as the acceleration energy increases and as the range of the implanted silicon extends. In particular, when the acceleration energy exceeds 40 KeV or so, the junction leakage current greatly increases, as can be seen from the figure. With the acceleration energy of 40 KeV, the range of implanted silicon reaches half (50 nm) of the thickness of the n-type lightly-doped diffused regions 19 which is about 100 nm. It is hence desired that silicon or nitrogen should be accelerated with such an acceleration energy at which silicon or nitrogen is implanted to a depth of ½ or less of the thickness of the n-type lightly-doped diffused regions 19, to reduce the junction leakage current.

Figure 8:
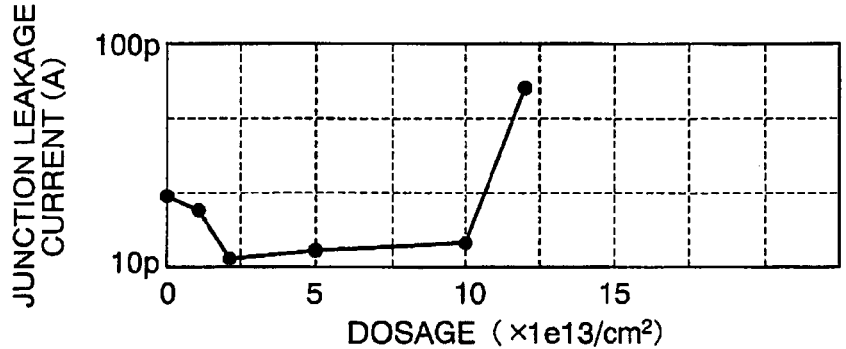
FIG. 8 is a graph showing the relationship between the junction leakage current of 10-kilobit memory cells and an acceleration energy.
Figure 9:
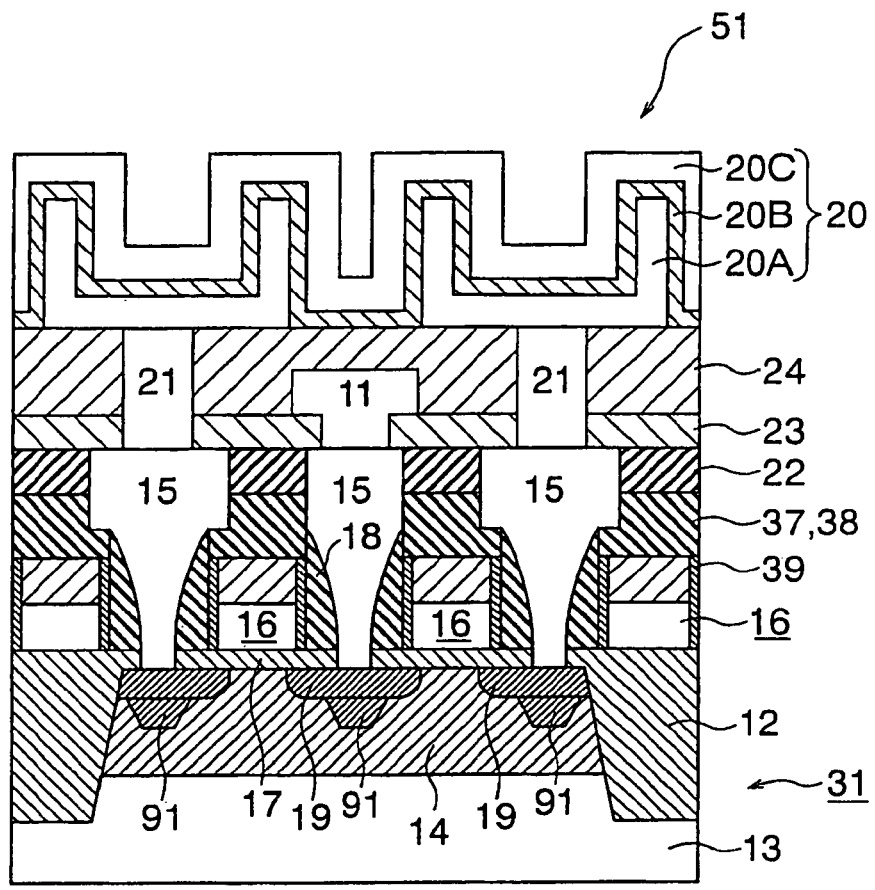
FIG. 9 is a sectional view showing the structure of a conventional semiconductor device.
Figure 10:
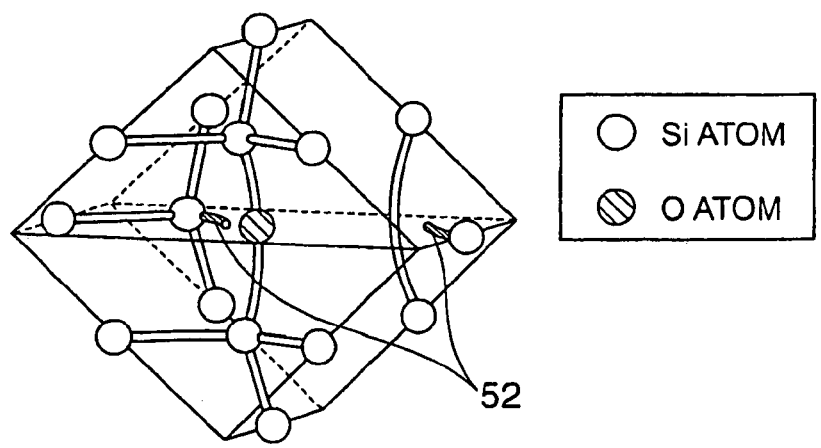
FIG. 10 is a perspective view schematically showing the vacancy type defects and atomic bonds in the vicinity of the defects.

FIG. 8 shows the relationship between the junction leakage current of 10-kilobit memory cells and the dosage, obtained by changing the dosage of silicon implantation in the method for manufacturing the semiconductor device according to the present embodiment. Measurements were carried out under conditions similar to the conditions in the measurements represented in FIG. 7. The point at which the dosage is zero indicates the case where silicon implantation was not carried out.

The junction leakage current starts decreasing after the dosage of the silicon implantation exceeds $1\times10^{13}/cm^2$. After the dosage further exceeds $1\times10^{14}/cm^2$, the junction leakage current increases to be greater than the case of implanting no silicon. An optimal range of the dosage of the silicon implantation can hence be said to be 1×1013/cm2 to 1×1014/cm2.

Since the above embodiments are described only for examples, the present invention is not limited to the above embodiments and various modifications or alterations can be easily made therefrom by those skilled in the art without departing from the scope of the present invention.

If the present invention is applied to manufacture of a DRAM device, the data retention capability of memory cells of the DRAM device will be improved. It is therefore possible to extend the refresh cycle so that electric power consumed by charging and discharging can, be reduced. Thus, a semiconductor device manufactured according to the present invention can restrain power consumption. Hence, manufacture of a semiconductor device for use in a cellular phone or in a device which works at a high temperature may be cited as a particularly preferable practical example of the present invention.

What is claimed is:

1. A method for manufacturing a semiconductor device comprising the consecutive steps of:
    implanting a dopant in a semiconductor substrate;
    heat treating said semiconductor substrate to diffuse said dopant for forming source/drain diffused regions in said semiconductor substrate;
    implanting silicon or nitrogen in top portions of said source/drain diffused regions;
    heat treating said semiconductor substrate to diffuse said silicon or nitrogen in said source/drain diffused regions, to allow said silicon or nitrogen to substitute for vacancies remaining at stress risers of said source/drain regions; and
    forming a MOS transistor including said source/drain diffused regions;
    wherein said silicon or nitrogen is doped at a dosage of $1\times10^{13}$ to $1\times10^{14}$ $cm^{-2}$.

2. The method according to claim 1, wherein said silicon or nitrogen is accelerated at an acceleration energy which allows said silicon or nitrogen to be implanted at a depth equal to half a thickness of said source/drain diffused regions.

3. The method according to claim 2, wherein said thickness of said source/drain diffused regions is not larger than 200 nm.

4. The method according to claim 1, wherein said dopant is phosphorous and is doped at a dosage of $1\times10^{13}$ to $1\times10^{14}$ $cm^{-2}$.

5. The method according to claim 1, wherein said heat treating step for diffusing said dopant is performed in an oxidizing ambient.

6. The method according to claim 1, wherein said step of heat treating to diffuse said dopant is performed at a substrate temperature of 900 to 1100 degrees C. for a time interval of 1 to 60 seconds.

7. The method according to claim 6, wherein said dopant is phosphorous and implanted at a dosage of $1\times10^{13}$ to $1\times10^{14}$ $cm^{-2}$.

8. The method according to claim 1, further comprising the steps of:

forming a gate electrode structure on the semiconductor substrate; and implanting said dopant into said semiconductor substrate using said gate electrode structure as a mask.

9. The method according to claim 1, A method for manufacturing a semiconductor device comprising the consecutive steps of: implanting a dopant in a semiconductor substrate; heat treating said semiconductor substrate to diffuse said dopant for forming source/drain diffused regions in said semiconductor substrate; implanting silicon or nitrogen in top portions of said source/drain diffused regions; heating treating said semiconductor substrate to diffuse said silicon or nitrogen in said source/drain diffused regions, to allow said silicon or nitrogen to substitute for vacancies remaining at stress risers of said source/drain regions; and forming a MOS transistor including said source/drain diffused regions; wherein said heat treating step to diffuse said dopant is such that an oxide film formed on said semiconductor substrate has a thickness after said heat treating step, which is within 1.1 times a thickness of said oxide film prior to said heat treating step.

* * * * *